(12) United States Patent
Li et al.

(10) Patent No.: US 7,316,748 B2
(45) Date of Patent: Jan. 8, 2008

(54) APPARATUS AND METHOD OF DISPENSING SMALL-SCALE POWDERS

(75) Inventors: Xiaochun Li, Madison, WI (US); Yong Yang, Madison, WI (US); Hongseok Choi, Madison, WI (US)

(73) Assignee: Wisconsin Alumni Research Foundation, Madison, WI (US)

(*) Notice: Subject to any disclaimer, the term of this patent is extended or adjusted under 35 U.S.C. 154(b) by 99 days.

(21) Appl. No.: 10/841,227

(22) Filed: May 7, 2004

(65) Prior Publication Data
US 2005/0211163 A1 Sep. 29, 2005

Related U.S. Application Data

(63) Continuation-in-part of application No. 10/192,228, filed on Jul. 10, 2002, now abandoned.

(60) Provisional application No. 60/375,277, filed on Apr. 24, 2002.

(51) Int. Cl.
*B05C 19/00* (2006.01)
*B05B 3/14* (2006.01)

(52) U.S. Cl. .................. 118/308; 118/612; 118/303; 239/102.2; 239/659; 222/200

(58) Field of Classification Search ............ 118/308, 118/303, 309, 612; 239/102.2, 659; 222/200; 264/497, 430, 434, 460; 425/78, 174.4; 427/553, 427/600, 180; 419/6, 66
See application file for complete search history.

(56) References Cited

U.S. PATENT DOCUMENTS

| | | | | |
|---|---|---|---|---|
| 4,627,990 A | * | 12/1986 | Saga et al. | 427/10 |
| 4,648,557 A | * | 3/1987 | Young | 239/102.2 |
| 6,025,034 A | * | 2/2000 | Strutt et al. | 427/450 |
| 6,401,795 B1 | * | 6/2002 | Cesarano et al. | 164/46 |
| 2002/0170890 A1 | * | 11/2002 | Keicher et al. | 219/121.64 |

FOREIGN PATENT DOCUMENTS

JP 01076837 A * 3/1989

OTHER PUBLICATIONS

Abstract of JP01076837A.*

* cited by examiner

*Primary Examiner*—Yewebdar Tadesse
(74) *Attorney, Agent, or Firm*—Boyle Fredrickson, S.C.

(57) ABSTRACT

An apparatus and method of dispensing small-scale powders for a variety of applications, including, for example, fabricating a three-dimensional heterogeneous small-scale device, includes using a feed mechanism that causes motion of the powder particles and the steps of depositing fine heterogeneous materials (such as dry powders and biological materials) towards a substrate. The depositing step preferably includes providing a feed mechanism having an input to receive the material, an output, and a source of ultrasonic vibration to impart a torsional force on the material so as to precisely discharge the material from the output. To improve particle flowability, a cooling system is provided to cool the source, generally above a threshold input voltage.

28 Claims, 15 Drawing Sheets

APPARATUS AND METHOD OF DISPENSING SMALL-SCALE POWDERS

CROSS-REFERENCE TO RELATED APPLICATIONS

This application is a continuation-in-part of U.S. Ser. No. 10/192,228, filed Jul. 10, 2002, now abandoned which claims the benefit of U.S. Provisional Application Ser. No. 60/375,277, filed Apr. 24, 2002, the entire contents of each being hereby expressly incorporated by reference herein.

BACKGROUND OF THE INVENTION

1. Field of the Invention

The present invention is directed to an apparatus and method of depositing small-scale powders, and more particularly dispensing powders for a variety of applications including manufacturing small-scale devices such as microelectromechanical systems (MEMS), biomedical instruments and display instruments.

2. Description of Related Art

Micro-electromechanical systems (MEMS) technology is a manufacturing technology that embodies a way of making complex electromechanical systems using batch fabrication techniques similar to the way integrated circuits are made, and making such electromechanical devices along with electronics. MEMS is used in a wide range of applications ranging from polymerized chain reaction (PCR) microsystems to blood pressure monitoring to air-bag accelerometers and active suspension systems for automobiles. Overall, MEMS is an enabling technology allowing the development of "smart" products by facilitating the computational ability of microelectronics in connection with the detection and control capabilities of small-scale sensors and small-scale actuators.

Classically, sensors and actuators have been the most costly and unreliable part of a macro-scale system which may include some combination of sensors, actuators and electronics. With a MEMS fabricated device, costs are typically significantly lower than a comparable macro scale system. Moreover, MEMS devices can be significantly more reliable than corresponding macro-scale systems. Note that the terms "micro-scale" and "macro-scale" are used herein to generically refer to small scale and large scale manufacturing techniques. The terms "micro" and "micro-scale" are not intended to limit the applicability of the present invention in any way.

In general, conventional MEMS manufacturing includes the integration of mechanical elements, sensors, actuators and electronics on, typically, a common silicon substrate through the use of micro fabrication technology. While the electronics are typically fabricated using integrated circuit (IC) process sequences (for example, CMOS), the micromechanical components are fabricated using compatible micro machining processes that selectively etch away parts of the silicon wafer or add new structural layers to form the mechanical and electromechanical devices.

There are three basic building blocks in conventional MEMS fabrication technology including the ability to (1) deposit films of material on a substrate, (2) apply a patterned mask (application specific) on the films by photo lithographic imaging, and (3) etch the films selectively to the mask. With specific reference to the first of these, deposition can be accomplished, typically, via a chemical reaction (e.g., LPCVD, EPCVD, epitaxy, etc.) or a physical reaction (PVD including sputtering and evaporation). In general, CVD or chemical vapor deposition techniques (such as low CVD) produce superior films to physical vapor deposition techniques (PVD), but at the expense of higher material cost and higher process risk. In either case, the process equipment is complicated, expensive and typically requires clean-room conditions.

These MEMS techniques are two-dimensional (2D) processes with multiple steps that require complicated processing procedures, and only a limited number of materials can be processed through the use of these techniques. And, as 2D processes, these silicon-based techniques are not easily adaptable to building 3D devices such that enclosed volumes of arbitrary shape and composition are difficult to make without the use of micro assembly.

Overall, although the most widely used MEMS fabrication material, there are significant drawbacks associated with fabricating MEMS devices with silicon. Conventional methods of fabricating silicon-based devices have a litany of limitations including the types of devices that can be produced, as well as strict process conditions. In addition, silicon itself has several shortcomings as a structural/mechanical material.

In addition, the reliable mechanical properties of MEMS are critical to the safety and functioning of these complex devices. In this regard, MEMS should be capable of being built using a wider selection of materials, including alloys, polymers, ceramics and heterogeneous materials that have superior mechanical and thermal properties to silicon. Micro-components with high aspect ratios, complex geometries, three-dimensional and complex microstructures are essential in many applications and can deliver a new generation of functionality and performance. Nevertheless, little work has been done to successfully attain efficient micromanufacturing techniques for the fabrication of functionally and geometrically complex heterogeneous MEMS.

A significant challenge to the proliferation of MEMS devices is the development of processes that can be implemented in the wide range of applications and materials. Many of the largest beneficiaries of MEMS technology will be firms that have no capability or competency in micro fabrication technology. As a result, a manufacturing solution allowing these organizations to have responsive and affordable access to MEMS fabrication resources for prototyping and manufacturing is desired.

Another technology evolving concurrently with MEMS development, known as solid freeform fabrication (SFF) (also called "layered manufacturing" or "rapid prototyping") has emerged as a popular manufacturing technology for rapid production. SFF machines build parts layer-by-layer directly from CAD models without the fixturing/tooling or human intervention demanded of conventional processes. This manufacturing technology enables the building of parts that have traditionally been impossible to fabricate because of their complex shapes or of their variety of materials. A variety of SFF processes have been used to create multi-material parts.

Referring to FIG. 1, an SFF system 10 includes a first CPU 12 having CAD/CAM software to communicate a particular design of a device to be fabricated to the process components of system 10. In particular, CPU 12 communicates with an automatic process planner 14 which, typically, slices the CAD data from CPU 12 to a two-dimensional layer. Further, process planner 14 provides trajectory planning, as known in the field. Process planner 14 thereafter communicates with a process machine 16 to provide motion control for automatic layered fabrication of the device.

Known SFF techniques include 3D printing that has been applied to build parts with composition control. Other SFF processes include SLS (selective laser sintering) that has been used to build multi-material and functionally gradient materials, and LENS (laser engineered net shape) which has been used to tailor certain physical properties of materials.

In addition, research in this area has been directed to using several layered manufacturing processes to create 3D microscale components. For instance, micro-stereo lithography has been used to develop complex 3D microstructures. Movable microstructures have been made by the use of two-photon 3D micro-fabrication with sub micron resolution and electrochemical fabrication (EFAB) is a technique that specializes in the fabrication of dense micro-metal parts by electroplating. Although useful for their particular purposes, each of these micro SFF processes are not suitable to build 3D heterogeneous MEMS due to their limited flexibility in changing material composition in situ.

Another emerging SFF process, known as laser-assisted shape deposition manufacturing (SDM), has been developed to fabricate macro-scale fully dense structures. In comparison to most additive SFF processes, SDM uses sequential additive (deposition of part materials and sacrificial materials) and subtractive (material removal) steps to form 3D structures, similar to traditional techniques.

Notably, SDM allows control of material location and material properties in 3D space. SDM has been used to build complex 3D macro-shapes with internal cooling channels, parts with continuously varying material properties, mechanisms, and heterogeneous parts with embedded sensors and actuators. However, SDM processes have not been scaled down to the small-scale, e.g., micro-world. For such an evolution, it was essential that the tools be capable of realizing additive and subtractive processes at the microscale.

Lasers, as versatile tools, have been used for heating, melting, and ablation. One laser-based tool, known as laser micro-machining, relies on the process of ablation. Laser micro-machining, especially with an excimer laser, can be used on a wide range of materials including polymers, ceramics, semi-conductors and metals.

While laser micro-machining is a subtractive process, laser micro deposition is an additive process. Laser particulate guidance (LPG) has been used to deposit materials at a 10 micron line width.

Because of its ability to produce a small laser spot size, micro-scale laser materials processing has become popular for micro-fabrication. Laser micro-machining processes create 2D and 3D MEMS in a spectrum of homogeneous materials. Nevertheless, known laser micro deposition processes are not capable of in situ local composition control of the material being deposited. Importantly, this composition control is vital to the production of heterogeneous microstructures. The primary drawback with known systems is the inability to mix and deliver various submicron/nano dry powders without additional chemical mixtures.

In view of the above-stated needs, the field of MEMS technology was in need of an improved manufacturing process allowing the fabrication of three-dimensional MEMS devices with a wide range of materials. The desired apparatus and method would provide an effective method of delivering small-scale dry powders to a substrate so as to maintain in situ local deposition control, and would also facilitate heterogeneous materials processing. Such a system would afford advantages in terms of no contact with the substrate during process, no chemicals, flexible feature size and shape, high precision, and the ability to work in air and at room temperature so as to obviate the above-noted problems with conventional MEMS techniques.

SUMMARY OF THE INVENTION

The preferred embodiments of the present invention are directed to a feed mechanism capable of dispensing small-scale fabrication materials such as dry engineering powders and biological cells (e.g., animal cells such as those of a chicken). Such an apparatus can be used in, for example, a laser-assisted micro-SDM process that integrates additive (laser micro-cladding) and subtractive (laser micro-machining) processes to form 3D heterogeneous MEMS. A vibrating device of the feed mechanism (that generates ultrasonic vibration) is used to facilitate the deposition.

In one aspect of the preferred embodiment, a method of fabricating three-dimensional heterogeneous small-scale devices includes the steps of depositing a fine heterogeneous powder towards a substrate. In addition, the method includes sintering or cladding the powder with a laser so as to produce a solid.

In another aspect of the preferred embodiment, an apparatus to dispense a small scale material includes a support, a capillary fixed to the support, and a source of ultrasonic vibration mechanically coupled to the capillary to cause torsional motion of the material within the capillary. The preferred apparatus can further include a three-axis stage to support the substrate and a piezoelectric actuator.

In yet another aspect of the preferred embodiment, a gap distance between the discharging end of the capillary and the substrate can be modified to alter the characteristic of the deposited material.

In another aspect of the preferred embodiment, the piezoelectric actuator comprises a lead zirconium titanate (PZT) element that has a resonant frequency of at least 20 KHz.

In yet another aspect of the preferred embodiment, the dispensed material is selected from a group including dry powder and a biological material, and the material particles are spherical.

According to another aspect of the preferred embodiment, a method of dispensing a substantially dry material includes the steps of providing a feed mechanism including, a support, a capillary and a source of ultrasonic vibration, and discharging the material from the capillary by causing torsional motion of the material.

In yet another aspect of the preferred embodiment, a particle feeding system includes support, a capillary fixed to the support to discharge the particles, and an actuator coupled to the capillary at a point offset from the center of the capillary so as to cause torsional motion of the particles.

According to a further aspect of the preferred embodiment, a cooling system is coupled to the actuator to improve the flow rate of the particles. Preferably, the actuator is a piezoelectric plate and the cooling system cools the actuator when the actuator is driven by a voltage generally above a threshold voltage.

These and other objects, features, and advantages of the invention will become apparent to those skilled in the art from the following detailed description and the accompanying drawings. It should be understood, however, that the detailed description and specific examples, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

A preferred exemplary embodiment of the invention is illustrated in the accompanying drawings in which like reference numerals represent like parts throughout, and in which.

DETAILED DESCRIPTION OF THE PREFERRED EMBODIMENT

Figure 1:
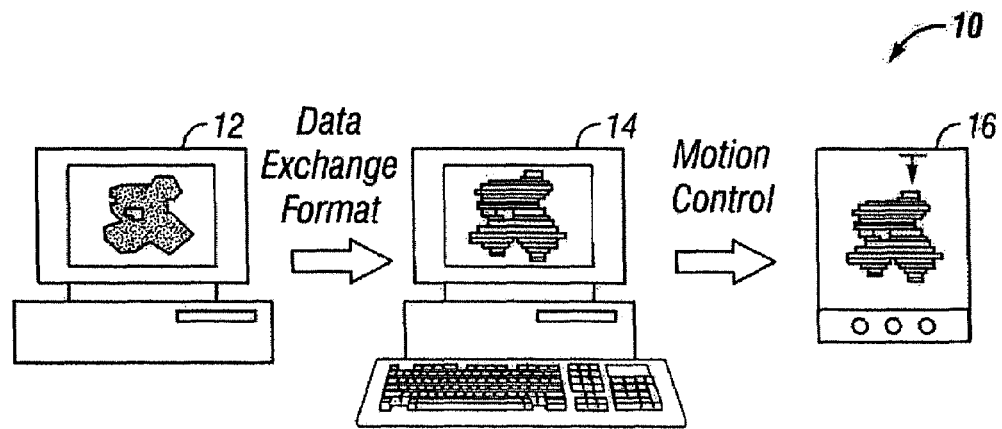
FIG. 1 is a schematic view of a prior art solid free-form fabrication (SFF) apparatus.
Figure 2:
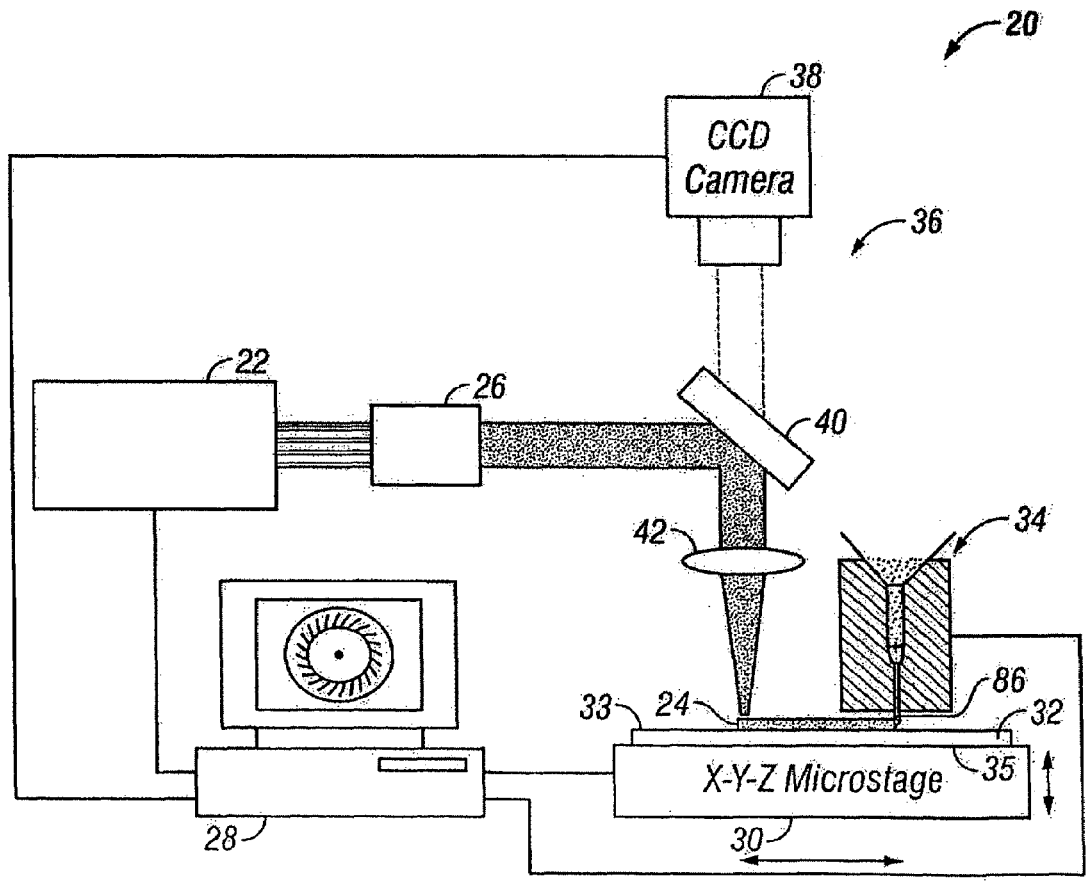
FIG. 2 is a block diagram illustrating the system of the preferred embodiment.

Turning initially to FIG. 2, a small-scale manufacturing system 20 for producing, for example, MEMS devices is shown. Manufacturing system 20 is based on laser-assisted SDM and includes a laser source 22 capable of micro-deposition and micro machining of various materials disposed on the substrate 32. Laser 22 is preferably a Nd:YAG (Neodymium: Yttrium Aluminum Garnet) laser for the material processing. To realize the additive and subtractive processes at small scale (e.g., micro scale) laser 22 is pulsed with different harmonic modes including 1064 nm, 532 mm, 355 nm, and 266 mm to provide the micro deposition and micro machining, as described below. Overall, laser source 22 operates as a micro additive and subtractive tool in a small scale SDM system. The output energy level of laser 22 is approximately 1.95 J/pulse at 1064 mm, 0.95 J/pulse at 532 nm, 0.4 J/pulse 355 mm, and 0.175 J/pulse for 266 mm.

With further reference to FIG. 2, a laser beam attenuator 26 is used to control laser beam intensity based on application requirements. Beam "B" output by laser source 22, after being conditioned by attenuator 26, is directed toward a reflecting device 40 that redirects beam "B" towards a lens 42 for focusing the beam prior to impingement upon the device (or a portion thereof) to be fabricated. Laser 22 is controlled by a CPU 28 (e.g., a PC) that provides CAD models that are used to build parts layer by layer without fixturing/tooling or human intervention. CPU 28 also controls an X-Y-Z microstage 30 to position substrate 32 in accordance with the CAD models input to CPU 28 (as well as feed mechanism 34, described below). Preferably, stage 30 is a conventional PC controlled three axis micro-stage, such as a LW-7XY and anoride 7-4 Z from Anoride Inc. that has 30 mm resolution and a speed up to approximately 200 mm/s. Moreover, CPU 28 is configured to accept G-code that is generated by Unigraphics CAD/CAM software to control the movement of the micro-stage.

Microstage 30 supports device material 24 to be processed, device material (e.g., a small-scale powder such as a metal) being deposited on a surface 33 of a substrate 32. Microstage 30 positions the substrate 32, supported by a surface 35 of microstage 30, for receiving the small-scale powder 24 from a feed mechanism 34 and, thereafter, positioning substrate 32 or processing by laser beam "B" output by laser source 22. In operation, pulsed laser 22 is controlled for specially and temporally precise micro-cladding and micro-machining. An optical system 36 including a CCD camera 38 and monitor is preferably employed to monitor the micro-fabrication process with a maximum magnification of about 3200. Furthermore, feed mechanism 34, as described in further detail below, provides an instrument to deposit micro/nano powders. Image acquisition hardware and software is also provided (not shown). Overall, system 20 provides laser assisted micro-SDM process that integrates additive (laser micro-clatting) and substractive (laser micro-machining) processes for fabricating 3D heterogeneous MEMS.

Next, turning to FIGS. 3A-3E, a schematic illustration of a device 50 fabricated according to the preferred embodiment is shown. Note that the SDM process 43 set forth in the flow diagram of FIG. 4 will be described in conjunction with the illustration in FIGS. 3A-3E for convenience.

As an overview, basic SDM fabrication methodology is to deposit individual segments of a part, and of support material structure, as near net shapes, and then machine each to net-shape before depositing and shaping additional material. Such a method takes advantage of a basic SDM deposition strategy that is to decompose shapes in segments, or "compacts" such that undercut features need not be machined but are formed by depositing onto previously deposited and shaped segment. For example, undercut part features are formed by depositing onto shaped support material compacts, and vice versa. Notably, the decomposition plan preserves the 3D-geometry information of the outer surface of each compact so that the desired shape of the CAD model can be accurately replicated (5 axis machining is available). Each compact and each layer is deposited as a near-net shape using one of several available deposition processes. The thickness of each compact depends not only on the local part geometry, but also on deposition process constraints. After the entire part is built up, the sacrifice support material is removed to reveal a final part. (Prinz and Weiss, Novel Applications and Implementations of Shape and Deposition Manufacturing, http://www2.cs.cmu.edu/afs/cs/usr/lew/www/NRR/nrrpaper.html).

Figure 3A:
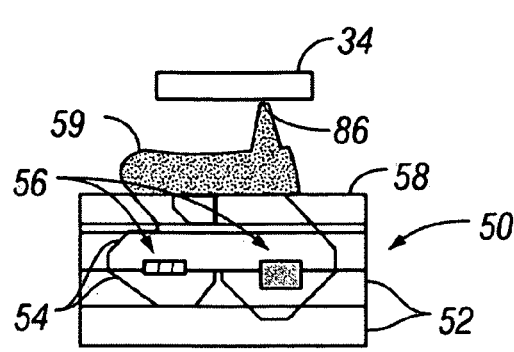
FIGS. 3A-3E schematically illustrate a device fabricated according to the SDM process steps of the preferred embodiment.

With continued reference to FIGS. 3A-3E, and in particular to FIG. 3A, a three-dimensional heterogeneous structure 50 disposed on a substrate 32 (FIG. 2) and partially completed is shown. Structure 50 includes processed support layers 52 and part material layers 54, the latter of which includes embedded micro components 56. Device 50, at the point of processing shown in FIG. 3A, has an upper generally flat surface 58 that is configured to receive a quantity of, for example, part material 59 deposited on surface 54 by feed mechanism 34 (Step 45) after a start-up and initialization step (Step 44). Notably, feed mechanism 34 is adapted to readily deposit both part material and support material as required. Part material 59 is deposited according to computer control of XYZ stage 30 via CPU 28 (FIG. 2).

Figure 3B:
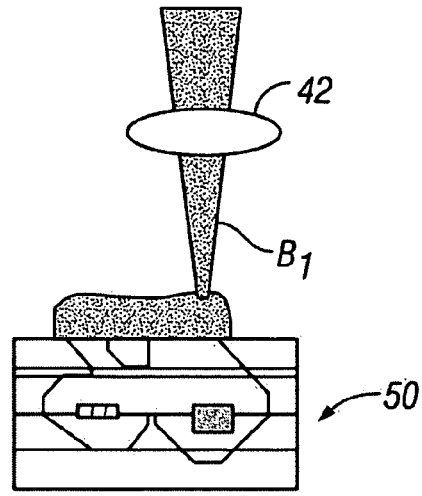
Figure 3C:
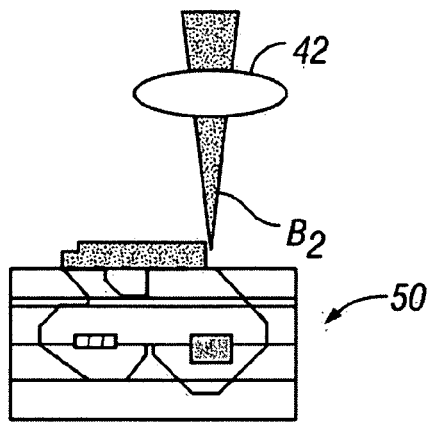
Figure 4:
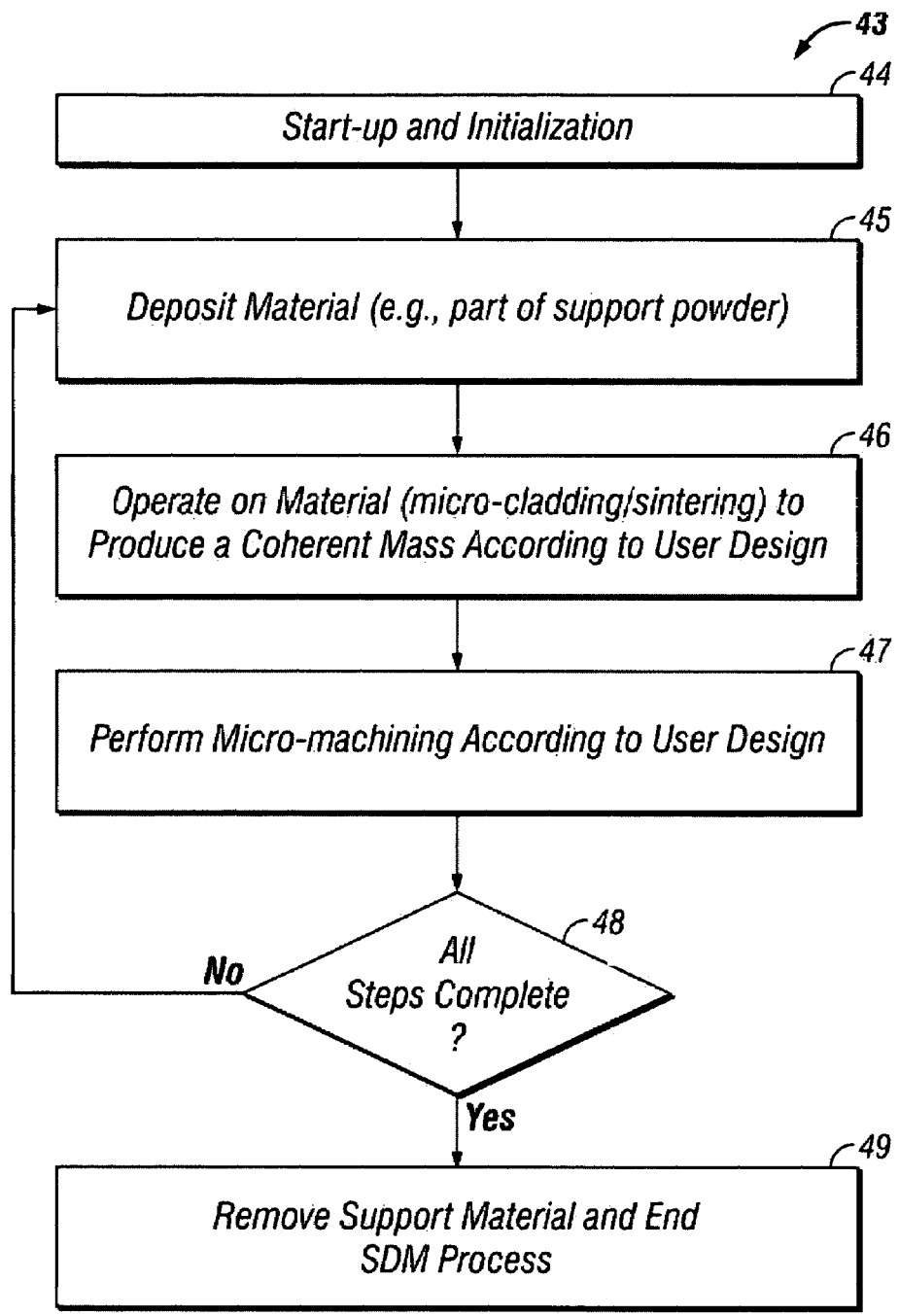
FIG. 4 is a flow diagram illustrating the process steps associated with building the device shown in FIGS. 3A-3E.

Continuing, in FIG. 3B, laser beam "B" of suitable wavelength is focused to generate a beam "B" to operate on the sample to produce a coherent mass. More particularly, beam "B" can be used in a micro-cladding step (Step 46), e.g., thus sintering the particles of part material 59 deposited on surface 52. Then, in FIG. 3C, laser beam "B" from laser 22 is conditioned to generate a beam "$B_2$" used in the micro-machining step (Step 47) of the SDM process. Notably, the micro-machining step is performed at an appropriate UV wavelength.

Figure 3D:
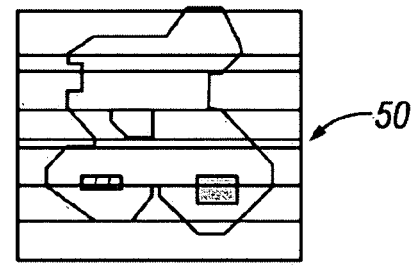
Figure 3E:
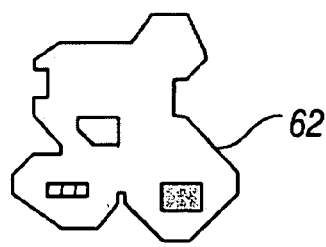

Then, as shown in FIG. 3D, after further of the previous steps are completed (Step 48), i.e., depositing and shaping, a three-dimensional heterogeneous MEMS device with support material results. Finally, as shown in FIG. 3E, the support material is removed to provide a completed three-dimensional heterogeneous MEMS part 62 remains as the SDM process terminates (Step 49).

Figure 5:
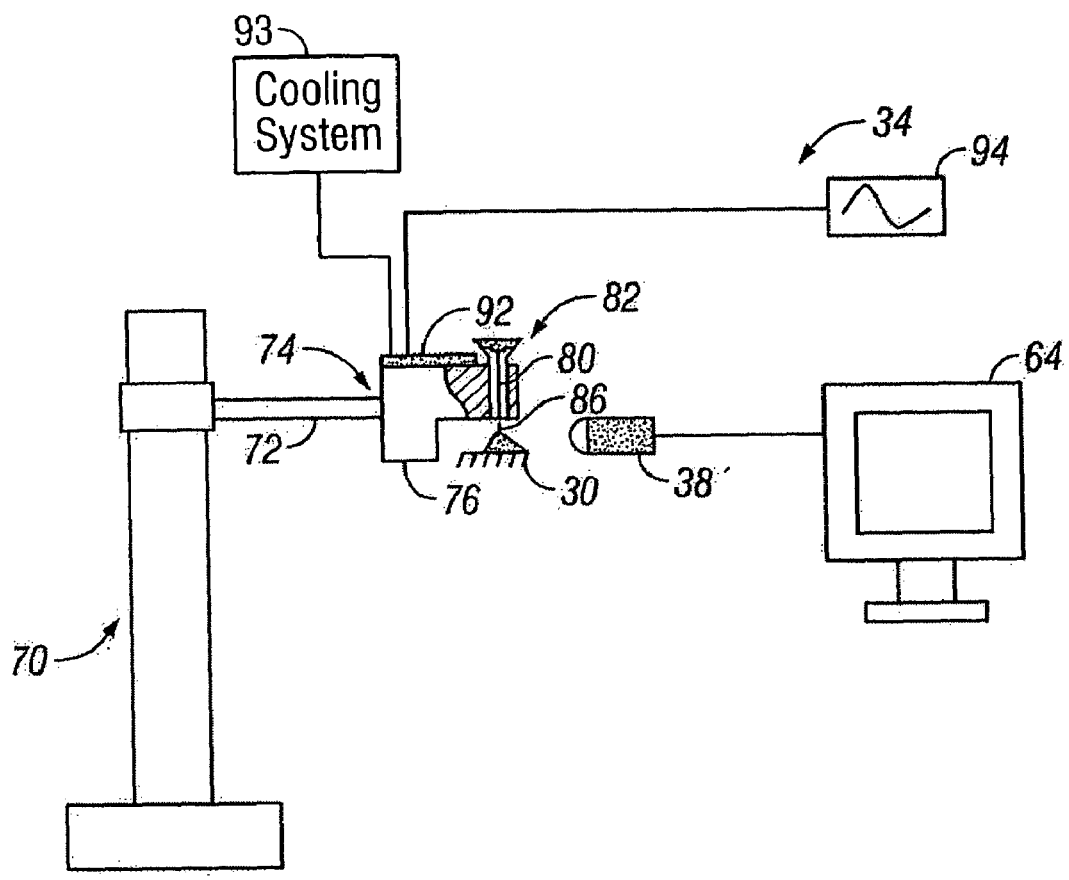
FIG. 5 is a block diagram illustrating the small-scale feed mechanism of the preferred embodiment.
Figure 5A:
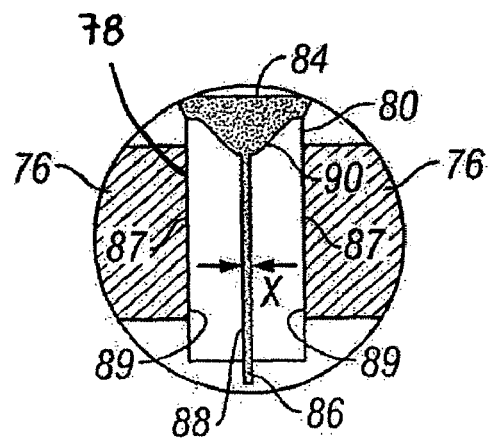
FIG. 5A is a magnified front elevational view of the capillary of the feed mechanism shown in FIG. 5.

Turning to FIGS. 5 and 5A, feed mechanism 34 is illustrated in further detail. In particular, feed mechanism 34 includes a support 70 having an arm 72 that has a distal end 74 that supports a housing 76. Support 70 is preferably a rigid structure made out of a high strength steel. In addition, housing 76 is preferably an aluminum block having an opening 78 machined therein. Opening 78 is configured to receive a capillary 80 preferably made of glass. It is critical that the outer surface 87 (FIGS. 5A) of capillary 80 maintain a tight-fit with an inner surface 89 of opening 78.

Capillary 80 has opposed ends including a first end 82 including a hopper 84 to receive material (i.e., powder) to be processed and a second end (i.e., tip) 86 through which material placed in hopper 84 is discharged. In operation, upon the discharge, the particles of powder material are deposited on a surface 33 of a substrate 32 supported by micro-stage 30. Preferably, a CCD camera 38 is used to monitor the deposition of the powder on substrate 32, CCD camera 38 being coupled to a computerized image acquisition system 64 to monitor the characteristics of the deposited material.

FIG. 5A shows capillary 80 in larger scale. Micro-capillary 80 includes a tapered central hole 88 that is assembled into aluminum block 76. The inner diameter of micro-capillary 80 is in at least micro-scale, such as less than 125 μm. This is in contrast to known laser assisted SDM techniques which typically implement dry material feeders in a feed nozzle having in inner diameter on the order of a 1000 microns, which allow control of the composition by mixing various powders that are normally larger than 50 microns. Notably, hopper 84 includes a lead end 90 that funnels the powder into hole 88 of capillary 80.

To cause material particles to propagate within tube 80, feed mechanism 34 includes an actuator 92 for applying appropriate forces to the capillary 80 to discharge the material onto, for example, substrate 32. Actuator 92 is preferably a piezoelectric device that is driven by a power supply 94 including a function generator and a power amplifier to generate ultrasonic waves through aluminum block 76 and towards capillary 80. Power supply 94 controls the frequency and amplitude of the ultrasonic waves that are ultimately generated by the piezoelectric device 92. More particularly, piezoelectric device 92 is preferably a thin plate made of lead zirconium titante (PZT) having an associated resonant frequency. PZT plate 92 is coupled to aluminum block 76 in conventional fashion so as to maintain a tight fit, as noted previously. In the preferred implementation, the resonant frequency of the PZT plate 92 was about 49 kHz. In this arrangement, ultrasonic waves produced by PZT plate 92 are effectively coupled into glass capillary 80 via aluminum block 76 due to the "tight fit" relationship. By discharging the powders in this fashion, system 20 is capable of local composition control of, preferably at around 49 KHz, it will expand and travel at a distance δ and ξ. Due deposited powders.

Figure 6A:
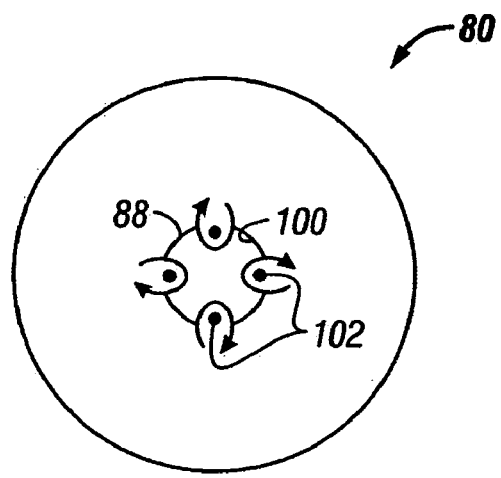
FIG. 6A is a top view illustrating movement of surface particles of the powder in response to ultrasonic actuation of a capillary.
Figure 6B:
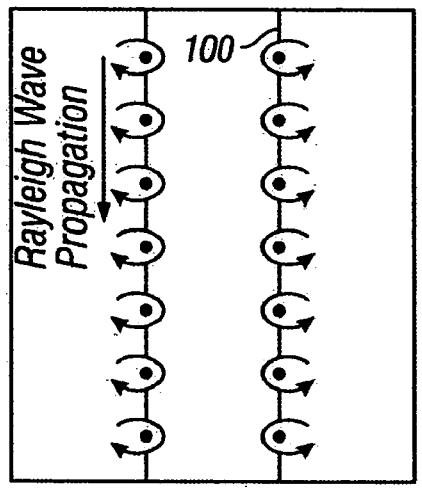
FIG. 6B is a cross-sectional front view of the capillary, illustrating the movement of surface particles of the powder relative to the capillary in response to ultrasonic actuation of the capillary.
Figure 6C:
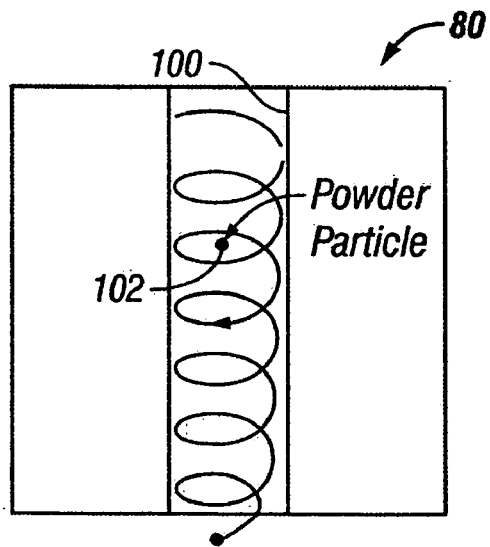
FIG. 6C is a front elevational cross-sectional view of the movement of a single particle along the length of the capillary in response to ultrasonic actuation of the capillary.

Turning to FIGS. 6A-6C, the motion of the particles of the powder within capillary 80 in response to actuation by ultrasonic-based feed mechanism 34 is illustrated. Hole 88 of capillary 80 includes an inner surface 100, preferably cylindrical, on which particles 102 of the subject powder reside and some of which adhere thereto. With suitable motion of inner surface 100 of capillary, preferably imparted on capillary 80 by one output of PZT actuator 92, the friction and adhesive forces between the powder and inner wall 100 of the capillary can effectively discharge the powders. FIG. 6A illustrates a top view of the motion of surface particles 102 at inner surface 100 of capillary 80. All surface particles along the perimeter of opening 88 move in an ellipse locus, as detected by CCD camera 38' (FIG. 5) which can be used to capture the motion of powder spinning inside capillary 80.

Figure 8:
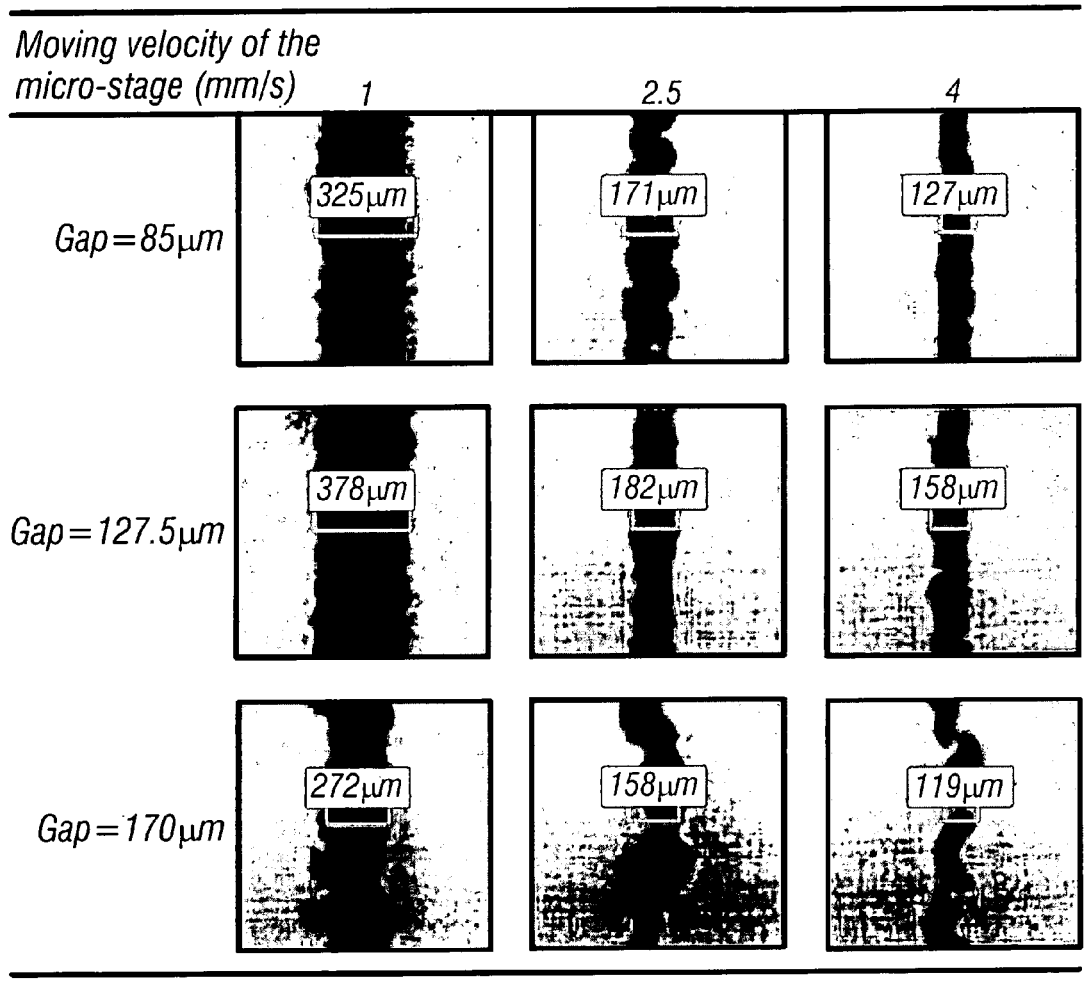
FIG. 8 illustrates images of deposited lines of powder while altering a gap distance and a translation speed of the substrate using the feed mechanism shown in FIG. 5.

FIG. 6B is a longitudinal section view of capillary 80. The motion of the surface particles along the longitudinal direction of capillary 80 is also in an ellipse locus. The motion of the surface induced RayleighWave, which is propagating on the elastic material surface. Notably, when capillary 80 is placed horizontally, powders were still discharged from second or outlet end 86 of capillary 80. As a result, clearly, the powders are driven to the second end or tip 86 of capillary tube 80 by friction and adhesive forces instead of by gravity. With these two surface motions (at any two opposed sides of the inner surface 100 of capillary 80), powders were driven to flow out of tip 86 of capillary 80 in a pattern of a helix, as depicted in FIG. 6C, which is verified by the image of the twisted broken line that was produced by feed mechanism 34 with gap distance "G" (see FIGS. 2 and 5) equal to 170 μm and moving velocity about 4 mm/s (FIG. 8). All experiments were completed in ambient air.

Figure 7:
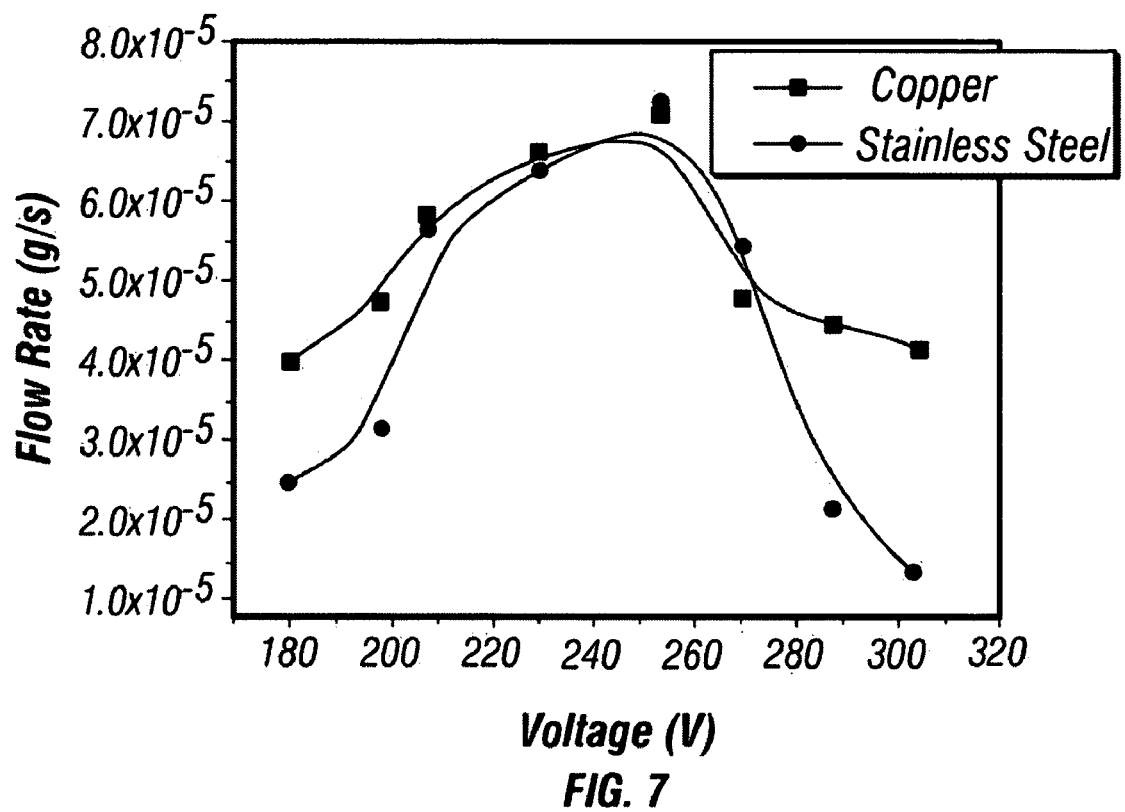
FIG. 7 is a graph illustrating flow rate versus voltage of the feed mechanism shown in FIG. 5.

It is notable that the flow rate of the material (e.g., fine powders) exiting micro capillary 80 is important for the small-scale deposition since it can affect the continuation, width and thickness of a deposited line. To measure the flow rates, a highly-sensitive scientific electric-balance 35 (typically positioned beneath the substrate 32) can be used to measure the mass of the discharged material. Powder flow rates for two types of materials (metals) that may be used to fabricate MEMS according to the preferred embodiment were measured. FIG. 7 shows a plot of the flow rate as the function of the voltage for each material, including spherical copper powders (3.0 µm nominal diameter) and stainless steel powders (3.0 µm nominal diameter). These flow rates were measured versus a varying voltage applied to vibrating element 92 (e.g., PZT actuator device) at its resonance.

Continuous discharges of the copper and stainless steel powders were achieved at a flow rate of approximately $10^{-5}$ g per second. As shown in FIG. 7, the flow rate increases as the voltage increases until the voltage reaches approximately 280 V. However, the flow rates decrease quickly beyond an applied voltage more than 280 V. This is likely caused by saturation of PZT plate 92 and higher temperature induced in the PZT plate at higher voltages. The difference in the flow rates between copper and stainless steel powders are typically associated with their different material properties.

Next, it is to be noted that high deposition quality of the dry powder is important for rapid micro-fabrication of heterogeneous MEMS. To characterize the quality of powder deposition, a series of straight lines of copper and stainless steel powders were deposited on a silicon substrate with an input voltage of 280V coupled to PZT plate 92. The results are shown in FIG. 8. A gap "G" (FIG. 5) between a distal or second end 86 of capillary 80 and substrate 32, as well as the moving velocity of substrate 32 where modulated to achieve a thin, continuous and smooth line of powder. FIG. 8 displays the images of such deposited lines of powders with various combinations of gap distances and velocities. In this case, feed mechanism 34 deposited a thin and continuous powder line with an optimized combination of a gap distance of 85 µm and a moving velocity of 4 mm/s. A twisted and broken line was also demonstrated with a combination of the gap distance of 170 µm and the moving velocity of 4 mm/s, thus indicating that the larger gap distance G causes more dispersion of the discharged powder resulting in less than ideal deposition of material on the substrate. In general, narrower gap distances consistently improve the quality of the deposition of the material, while increased speed can improve or lessen the quality of the deposition depending on gap distance (e.g., increased speed provides an improvement at smaller gap distances, as shown in FIG. 8).

Figure 15:
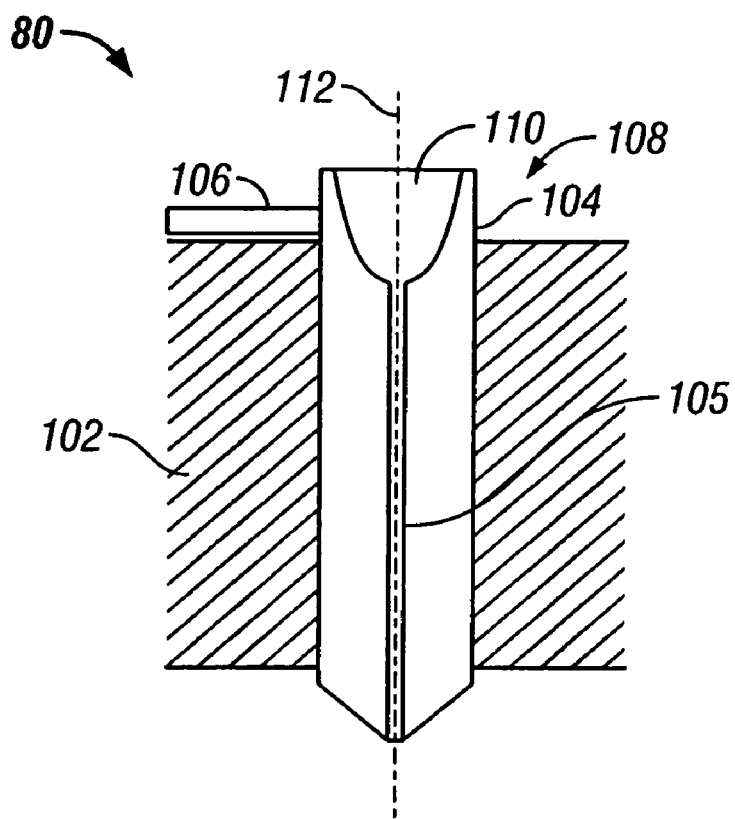
FIG. 15 is a partially broken away, cross sectional view of the feed mechanism of a preferred embodiment.
Figure 16:
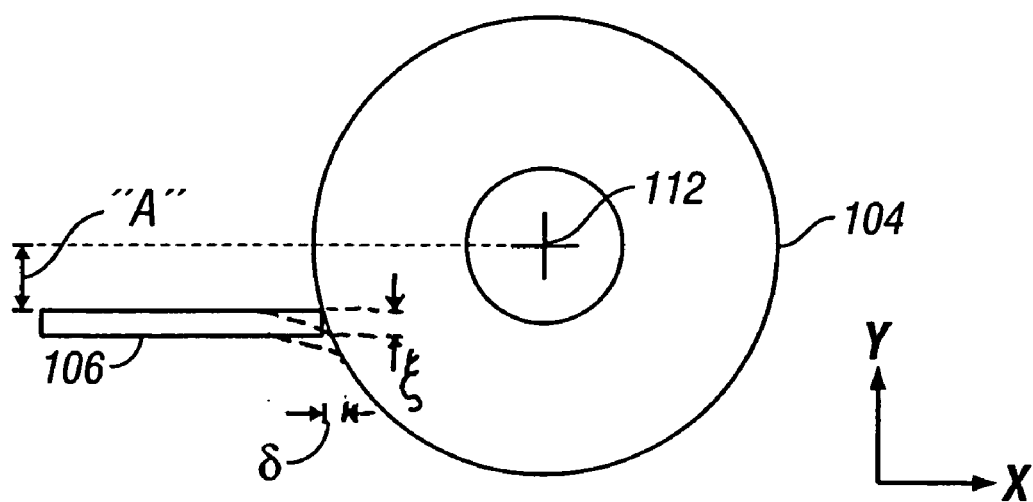
FIG. 16 is a top view of the capillary shown in FIG. 15.

FIGS. 15 and 16 illustrate in more detail a preferred embodiment of the feed mechanism. Turning initially to FIG. 15, a feed mechanism 100 includes an aluminum block 102 and a capillary 104, with an actuating element 106, such as ultrasonic actuating element, e.g., a PZT plate. PZT plate 106 rests against a first end 108 of capillary 104 defining a hopper 110. Hopper 110 in capillary 104 operates to help guide powders into capillary tube 105. In one preferred implementation, capillary 104 is made of borosilicate glass.

As shown in FIG. 16, the PZT plate 106 contacts capillary 104 at a region offset an amount marked "A" from a center longitudinal axis 112 of capillary 104. As PZT plate 106 is excited in a direction coincident with a longitudinal axis of plate 106 (i.e., in the "X" direction shown in FIG. 16), preferably at a frequency greater than 20 kHz and more preferably at about 49 kHz, it will expand and travel in the "X" and "Y" directions an amount δ and ξ, respectively, as illustrated in FIG. 16.

Due to the offset, "A," between the vibrational direction and the center 112 of capillary 104, the system imparts a periodical force on capillary 104 as PZT plate 106 collides with it. Again, the corresponding torsional motion of the particles is shown at FIGS. 6A-6C. More particularly, as the tortuous wave propagates along the capillary tube 105, the particles of the powder travel generally in an oval orbit as discussed previously.

The capillary tube 105 is, for example, a single bore ferrulue with an inner diameter of about 120 microns, and outside diameter of 2.5 millimeters, and a length of about 16 millimeters. Notably, an inner diameter of 50 microns can be obtained by adding a sapphire orifice.

Figure 17A:
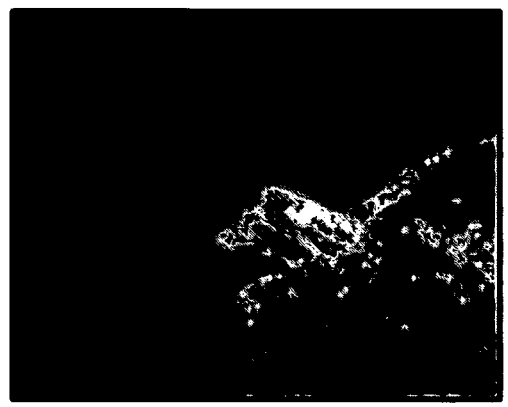
FIGS. 17A-17C are photos of a micro particle "rod" exiting the capillary.
Figure 17B:
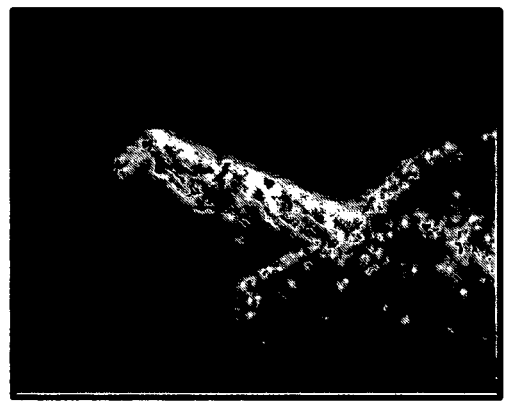
Figure 17C:
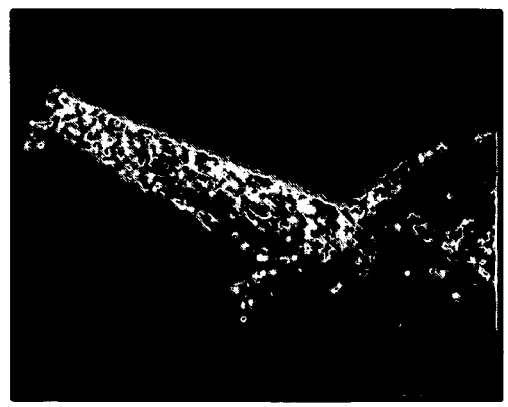

FIGS. 17A-C illustrate the powder feeding process out of capillary tip 86 in a highly controlled fashion. In fact, the process demonstrated forms a "rod" of material (i.e., powder) as it is dispense from the free end of the capillary. The powder packing is densified by the ultrasonic waves causing the powder density at the tip 86 to be much higher than that in the hopper 84. For example, for copper powder, powder density is about 4.6 g/cm$^3$ after feeding, while the density at the hopper 84 is less than 4.0 g/cm$^3$. The densely-packed particles stick together because of their large surface-to-volume ratio, and move out the feeding capillary 80 as a short porous wire (in FIG. 17C, the length of the "rod" is about 537 µm), feeding evenly in an upwardly inclined direction until the wire collapses under its own weight. In addition, FIGS. 17A-C illustrate the rotating motion of the powder demonstrating that the powders were fed in the helix fashion described in reference to FIG. 6C.

Figure 18:
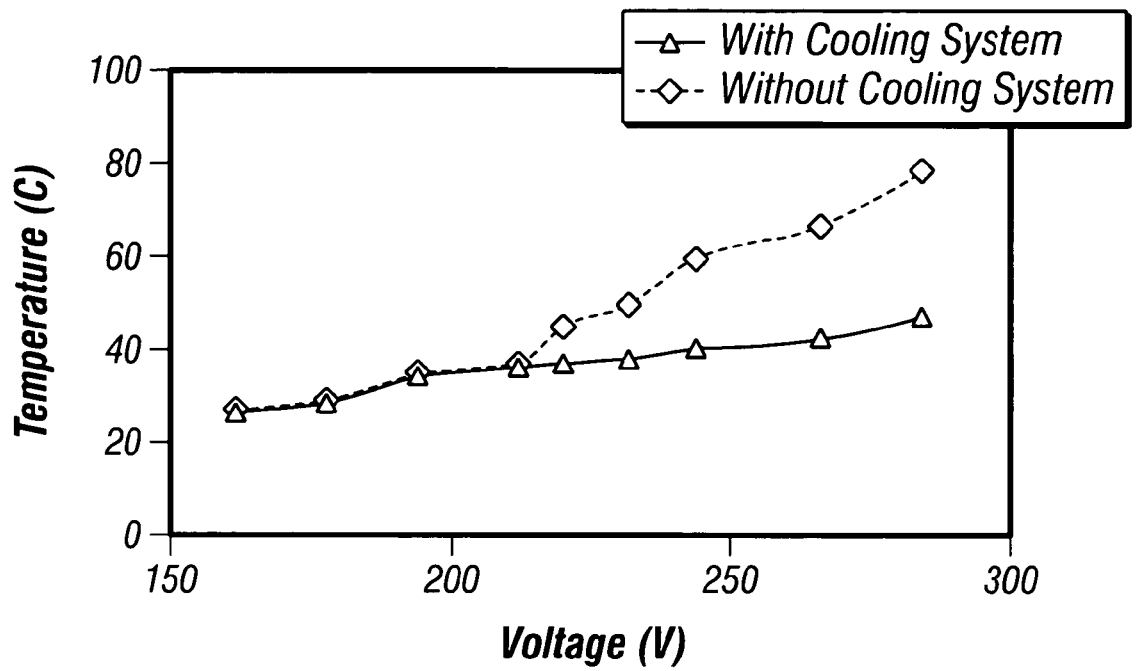
FIGS. 18 is a graph illustrating the temperature of the actuator versus driving voltage, with and without cooling the actuator.

Notably, the temperature of the PZT plate 92 increases with time due to heating effects within it. This thermal effect can influence the performance of the PZT plate 92 significantly. Therefore, a cooling system 93 (FIG. 5) can be used to control the temperature in the system 20. The cooling system 93, for example, may include a copper cooling block, two tubes, a water reservoir, and a micro pump. In this case, the copper cooling block is coupled to the PZT plate 92 to provide the necessary cooling. In FIG. 18, temperature was measured against voltage and flow rate. The data was graphed with and without the preferred cooling system. As highlighted in FIG. 18, the temperature of the system 20 is almost the same when the input voltage is generally below a threshold voltage, in this case, about 225 V. However, the temperature difference becomes significantly larger after the input voltage rises above 225 V.

Figure 19A:
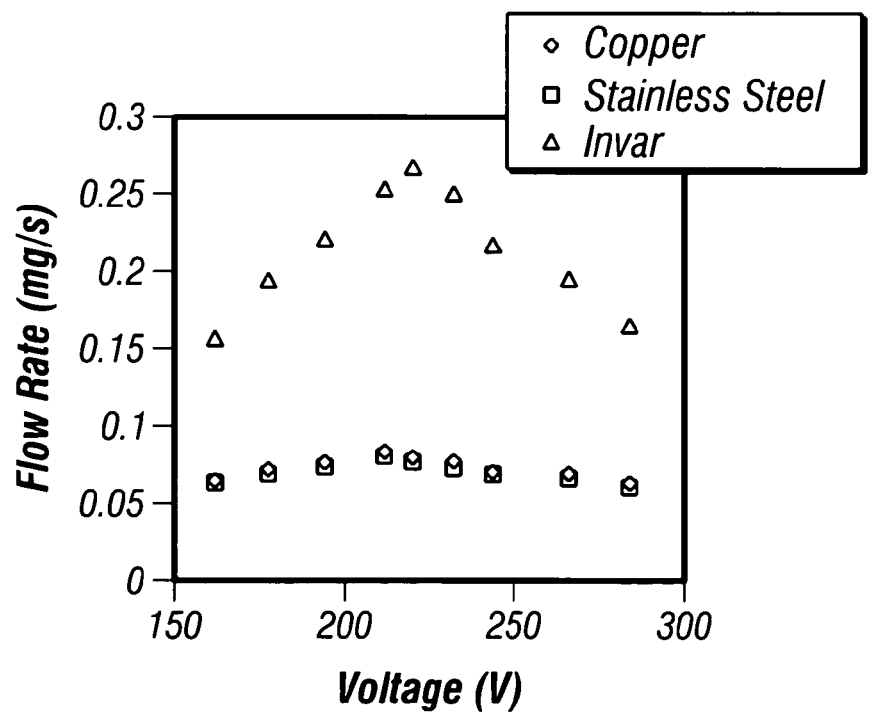
FIGS. 19A and 19B are graphs illustrating flow rate versus driving voltage for different materials using a first capillary, without and with cooling, respectively.

The material or powder flow rate is important to the performance of the system 20. To measure the flow rates, a highly sensitive electric-balance with a resolution of 0.1 mg, can be used to measure the mass of discharged powders. Preferably, a model SA 120 Rev-B, manufactured by Scientech, Inc., of Boulder Colo., USA can be used. FIGS. 19A and B illustrate powder flow rates for spherical copper powders, invar, and stainless steel powders measured against the voltage applied on the PZT plate 92. Continuous discharge of micro powders was achieved. As illustrated in FIGS. 19A and B the flow rates for the capillary tube 80 increases as the applied voltage increase until the voltage reaches approximately 225V. At that point, the flow rates decrease quickly as the applied voltage surpass 225V. This is caused by the thermal effect induced in the PZT plate at higher voltages, which is accommodated by cooling system 93.

Figure 20A:
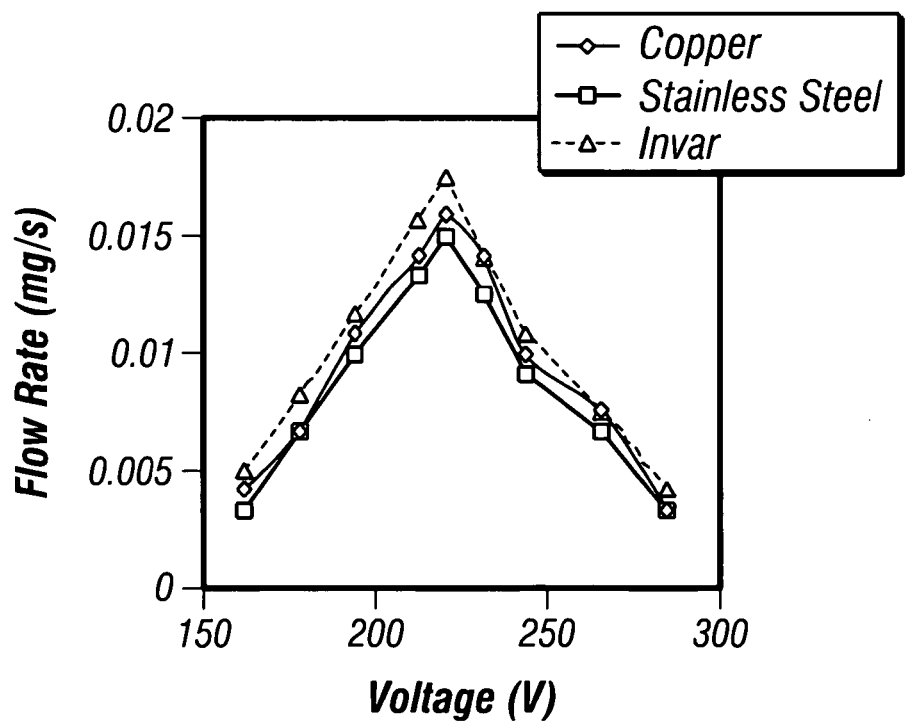
FIGS. 20A and 20B are graphs illustrating flow rate versus driving voltage for different materials using a second capillary, without and with cooling, respectively.

The difference in the flow rates for different powders results from the difference in flowability of the powders. For a capillary 80 with an inner diameter of 125 μm, the flow rates of Invar are higher than those of copper and stainless steel powders. (See FIGS. 19A and B). This is because the flowability of Invar powders is better than that of copper and stainless steel powders due to the larger size of Invar powders. However, when a capillary with an inner diameter of 50 μm is utilized, the flow rates are almost the same for all three types of powders. (See FIGS. 20A and B). This is because the inner diameter of the capillary is so small, the powders stick to each other inside the capillary tube and therefore ultrasonic force dominates.

Figure 19B:
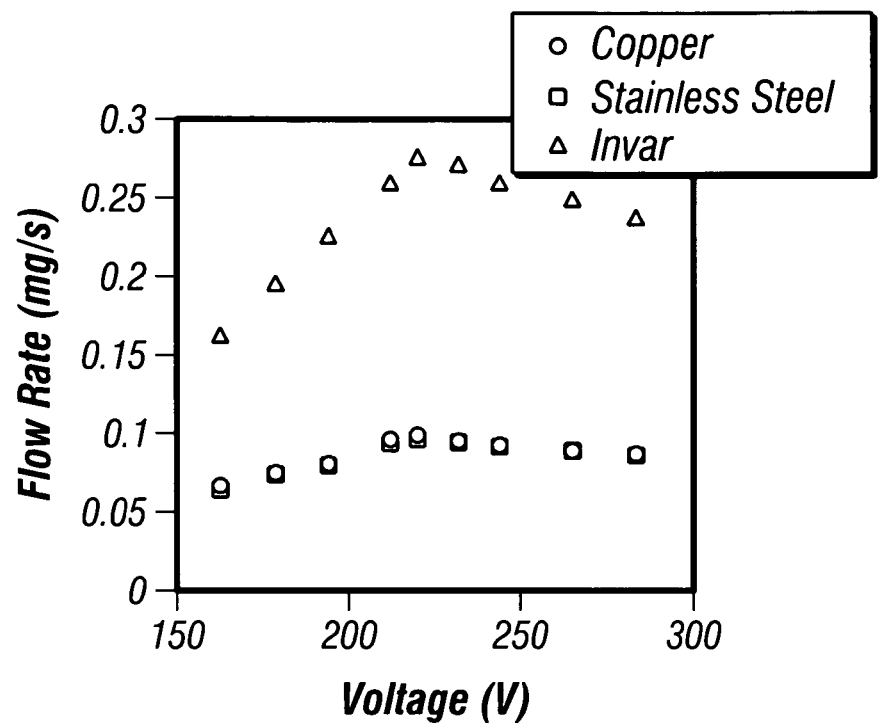
Figure 20B:
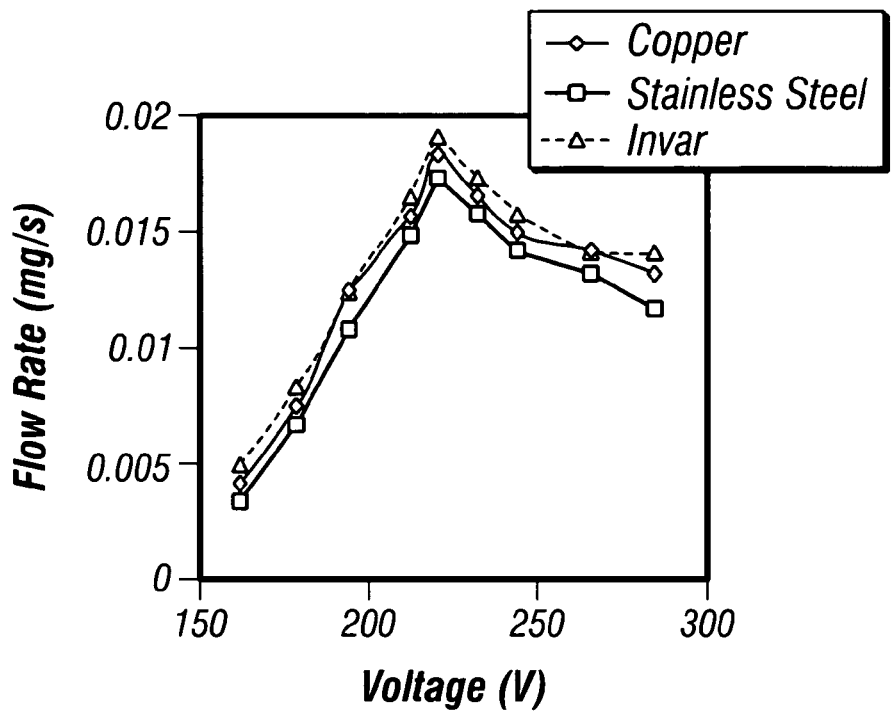

As illustrated by FIGS. 18-20 when a cooling system 93 is utilized, the flow rates are advantageously higher than without a cooling system 93 when the input voltage surpasses the threshold voltage, again, about 225 V. However, when the input voltage is below 225 V, there is almost no difference in the flow rates. Therefore, the cooling system 93 is most preferably employed when relatively high voltages are required (or desired) to drive particle motion.

The powders are driven by acoustic streaming and friction forces that were generated between the powders and the inner walls of the capillary 80 since the powder density is changing throughout the feeding process. In one embodiment, the ultrasonic wave along a capillary tube is generated by an actuator 92 (PZT plate) while a micro hopper 84 assists the powder feeding into the inner capillary tube 105. At the beginning of the powder feeding, acoustic streaming dominates and drives powders and air from the hopper 84 into the capillary 80. However, when the powder density becomes higher due to a pressure gradient along the capillary tube 105, the ultra-fine dry powders tend to stick together, forming a powder "rod", as noted previously. At that point, the friction between the capillary inner wall and the powder "rod" starts to dominate and drive the porous powder "rod" out of capillary 80.

For the acoustic streaming phenomenon, reference is made to Moroney, R. M., White, R. M. and Howe, R. T. 1991 "Ultrasonically Induced Microtransport," Proceedings of 1991 IEEE Micro Electro Mechanical System, 277-82, the entirety of which is hereby expressly incorporated by reference.

When the powder packing density becomes higher, the dry powders form a "porous rod," similar to a slide inside the capillary. Friction forces start to dominate over the force induced by acoustic streaming. At this stage, the "porous powder rod" is similar to the slide of a linear ultrasonic motor. For the ultrasonic surface friction driving, it should be assumed that the powder travels at the same velocity as the ultrasonic wave peak referenced in Moroney, then:

$$u = U_0 = \Pi \omega_0 \xi_0 (T/\lambda) \qquad \text{Equation 1}$$

Where $U_0$ is the wave peak velocity, $\xi_0$ is the vibration amplitude, $\omega_0$ is angle frequency and T is the thickness of elastic body and $\lambda$ wavelength. Notably, the acoustic velocity of fused silica is about 5760 m/s.

Figure 21:
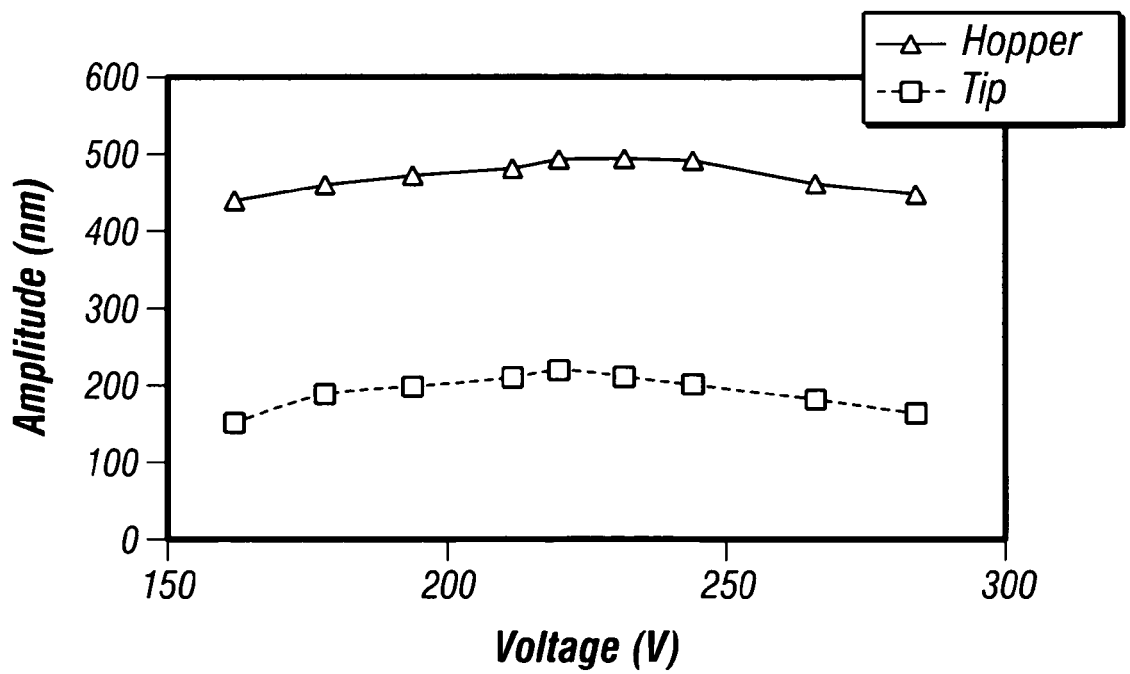
FIG. 21 is a graph illustrating vibration amplitude versus driving voltage at both the hopper and the tip of the capillary.

For the inventive system, it is reasonable to assume T is between the vibration amplitude and the wall thickness (about 1.1875 mm). The vibration amplitude of the capillary 80 is 0.25~0.5 μm (measured by a PSV-200), as shown in FIG. 21. The vibration amplitude at the hopper 84 and at the tip 86 is different. Thus the feed velocity u should be approximately between 1.0 μm/s and 2.5 mm/s by using Equation 1. For example, copper's feeding velocity was about 400 nm/s.

Small Scale Dispensing

An important aspect of the preferred embodiments is the ability of the system to deliver micro powders in a precise fashion. One key application is as part of the process of building MEMS-type devices, as described above. Another key application is the more general delivery of, for example, micro powders in a variety of environments. For instance, in the field of drug discovery, small quantities of valuable, newly developed compounds, must be dispensed, typically according to highly specific parameters. Such new compounds are often very expensive and the precise delivery of the powders for testing, etc. can provide a significant cost savings. The apparatus and techniques described herein allow scientists and other users to deliver small quantities of such valuable new compounds precisely with little lost product.

Laser Micro-Machining

Figure 9:
FIG. 9 is a graph illustrating depth of a hole produced by a laser versus the number of shots applied.

Laser micro-machining according to the preferred embodiment was also studied. The relationship between the number of laser shots and the depth of machined hole in stainless steel is shown in FIG. 9. With further reference to FIG. 2, an optical lens 42 with a nominal focus length of about 135 mm can used. And, beam diameter on the lens was set at 6.0 mm. Notably, the drilled depth in stainless steel is almost linearly proportional to the number of laser shots as illustrated by FIG. 9. This allows ready control of the depth of drilled holes.

Figure 10:
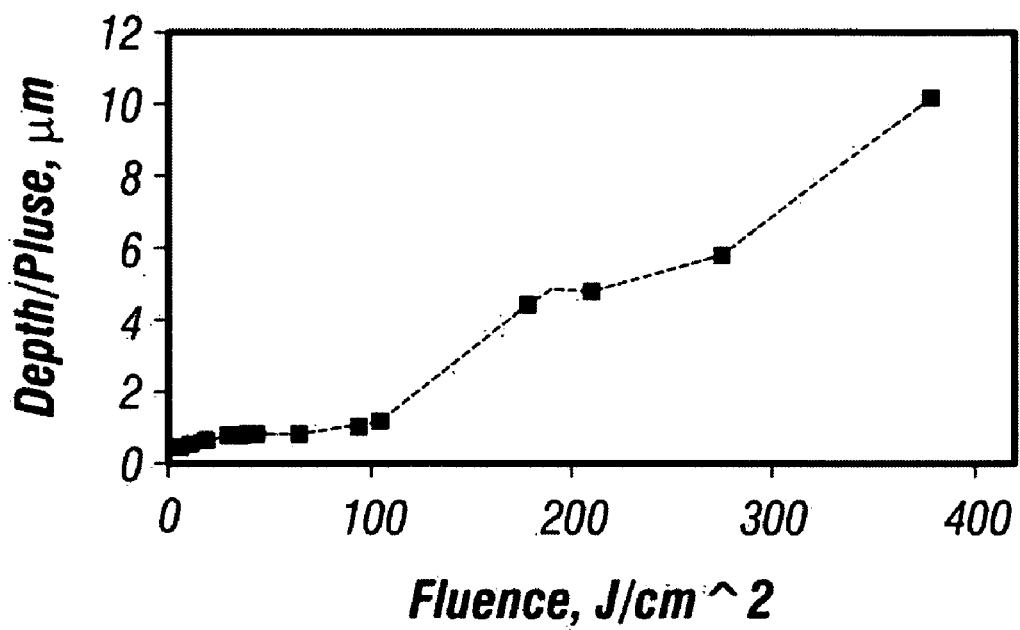
FIG. 10 is a graph illustrating depth of a hole produced by the laser versus the fluence.
Figure 11:
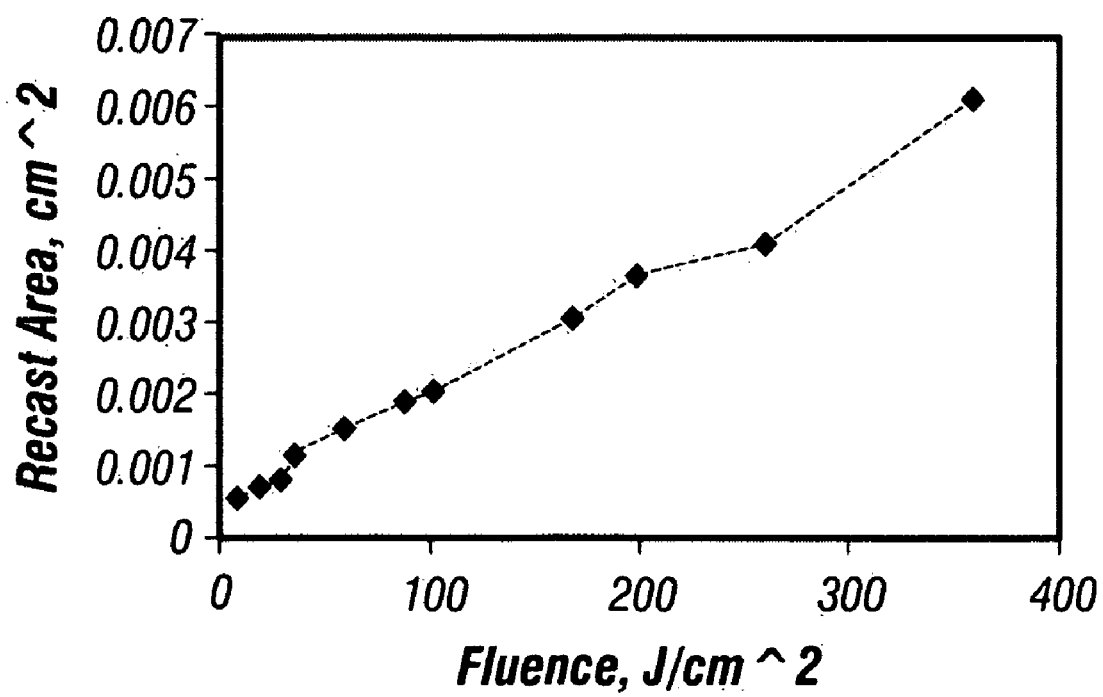
FIG. 11 is a graph illustrating the recast area versus the fluence during a laser macro-machining step of the preferred embodiment.

The laser intensity (also known as the laser fluence) also affects the depth of drilling significantly. By controlling laser intensity using a single pulse, FIG. 10 illustrates that the depth of a drilled hole increases rapidly with laser fluence after passing the ablation threshold. Then ablation rates remain almost constant as the laser fluency increases until up to 100 J/cm$^2$. The ablation rates then increase continuously with the increasing laser fluence. The recast area, which is a layer of debris on the surface of the material caused by the molten metal produced during laser micro-machining, increases with the laser fluence. FIG. 11 shows the relationship between the laser influence and the recast area.

Figure 12:
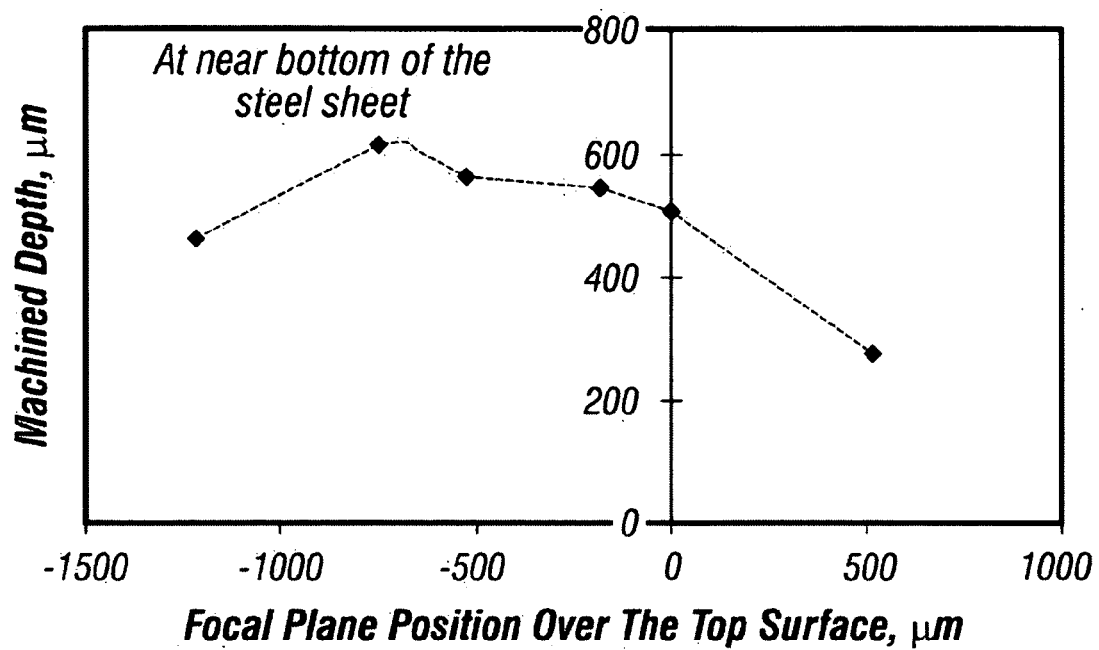
FIG. 12 illustrates the relationship between the focal position of the laser and the corresponding drill depth.
Figure 13:
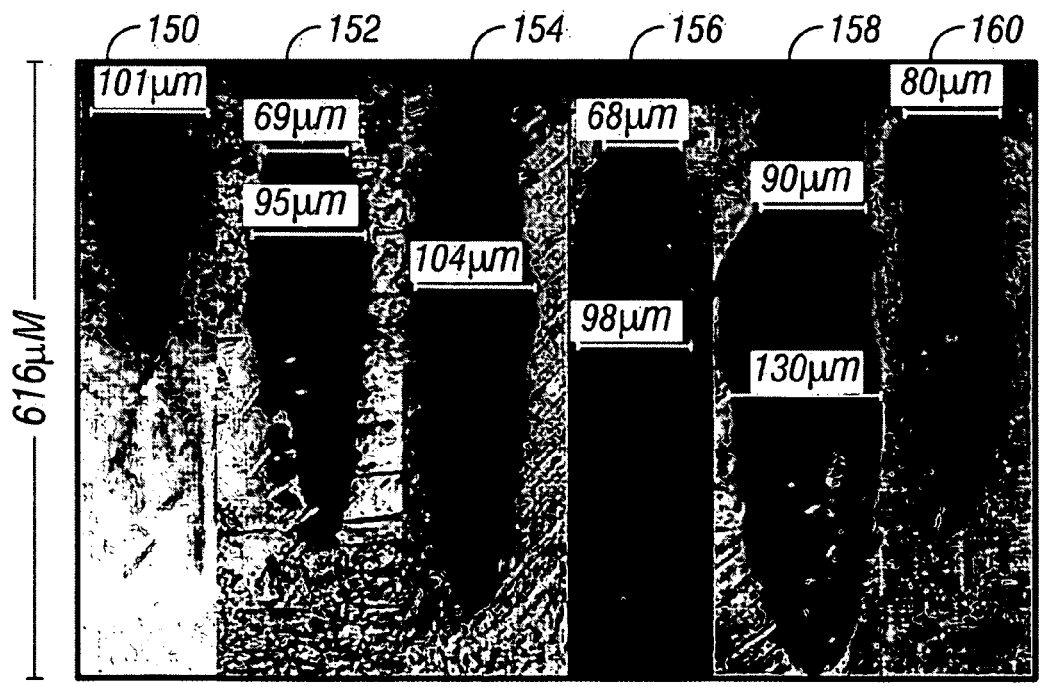
FIG. 13 is a series of images illustrating the shape and depth of the drilled holes under various focal plane positions.

Next, the location of the focal plane in relationship to the top surface of the sample was found to be very important for the laser micro-machining process. FIG. 12 shows the relationship between the focal position and drilled depth. With the same laser fluence and same number of laser pulses, the maximum depth is obtained when the focal plane of the laser beam is located at the bottom surface of the sample. FIG. 13 shows the shape and depth of the drilled holes under various focal plane positions. Image 150 in FIG. 13 corresponds to a case where the focal plane is positioned +0.524 mm relative to the sample surface in a conventional coordinate system. When the focal plane is lowered (via choice and position of lens 42) to the surface of the sample (0.0 mm), the depth of the hole increases but the width slightly increases, as shown in image 152. Then, when the focal plane is lowered further to −0.175 mm, the depth increases, and so does the width of the hole (photo 154). This continues as the focal plane is lowered further as shown in image 156 (−0.523 mm) and image 158 (maximum depth achieved when focal plane lowered to −0.742 mm) in FIG. 13, until the focal plane is lowered to −1.223 mm (image 160) at which point the depth retreats and so does the width.

Figure 14A:
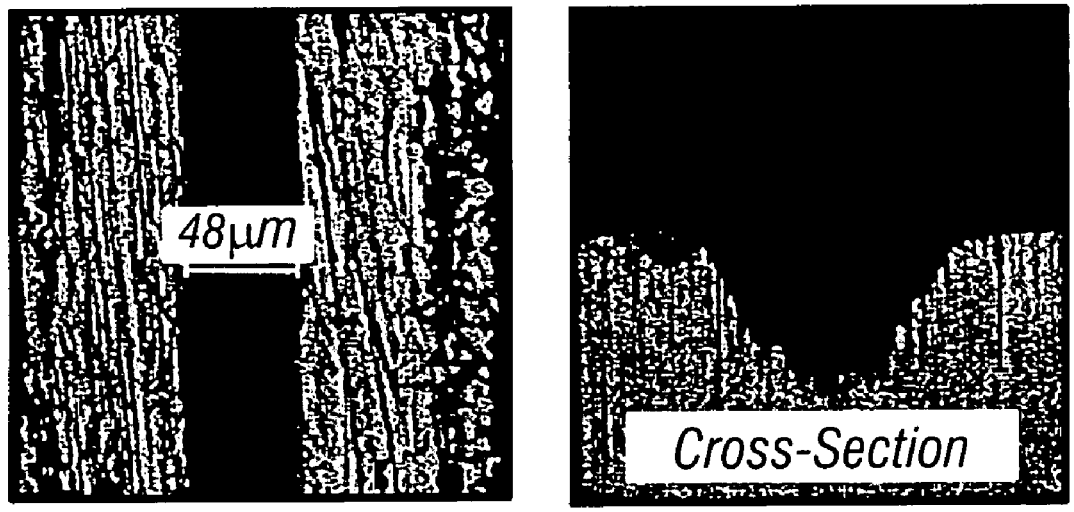
FIGS. 14A and 14B are a series of images illustrating the shape and depth of the machined channels.
Figure 14B:
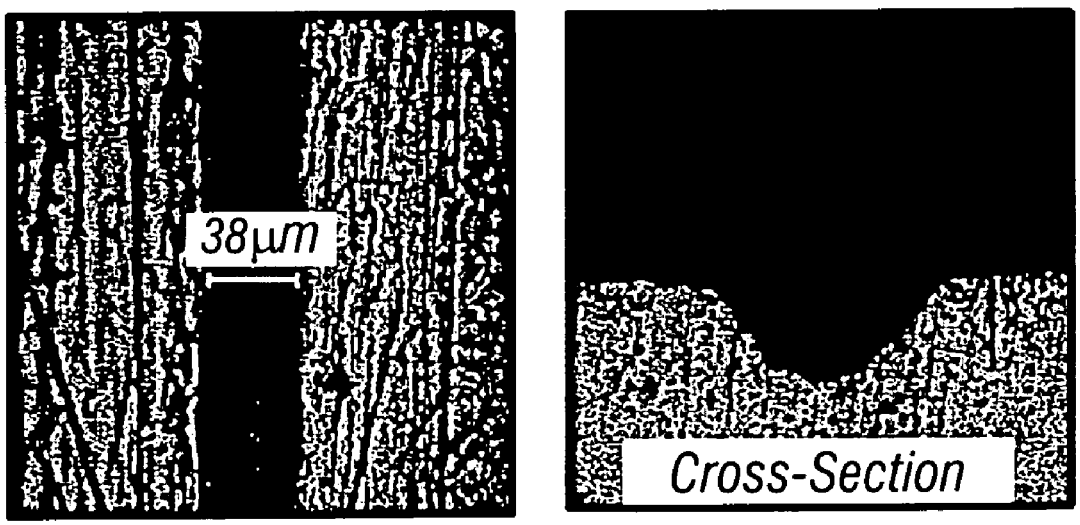

Referring next to FIGS. 14A and 14B, the moving velocity of substrate 32 related to laser beam "B" affects the shape and depth of the machined channels. The two channels shown in FIGS. 14A and 14B were machined under two moving velocities, a first at 0.1 mm/s in FIG. 14A and a second at 0.2 mm/s in FIG. 14B, under same laser fluence.

The slower moving velocity, 0.1 mm/s, results in a deeper depth, but also a wider channel. The optimum speed is necessary for the accurate machining according to the user's requirements for that application. The tapered angles are found to be quite large, up to 20°. The large tapered angles are typically caused by the beam quality (0.7 fit to Gaussian beam) and intensity variation of the beam. If a beam homogenizer is used, the tapered angles can be controlled to 3~5°.

In sum, the preferred embodiments can adapt SDM methodology to MEMS fabrication. By incorporating microdeposition and laser micromachining, the developed micro rapid manufacturing system 20 takes computer-aided design (CAD) output from a computer to reproduce micro components. A pulsed Nd:YAG laser 22 serves as a micro additive and subtractive tool in micro-manufacturing system 20.

To deposit micro and nano dry powders or biological materials (e.g., animal cells) precisely without chemical mixtures, an ultrasonic-based micro-feeding mechanism 34 is employed. The ultrasonic wave was effectively coupled into a glass capillary from aluminum block through a tight fit. Continuous discharges of the copper and stainless steel were achieved at a rate of approximately $10^{-5}$ g per second. Experiments showed that both the gap distance "G" between the feeding tip 86 and substrate 32 and the moving velocity of the substrate are critical parameters to deposit thin, continuous and smooth line. Ultrasonic waves stimulated the motion of the surface particles at the inner wall of the capillary. Friction and adhesive forces between the powder and inner wall of the capillary effectively discharged the powders.

Laser micromachining was studied with the laser wavelength of 355 nm. The drilling depth is almost linearly proportional to the number of laser shots. Laser fluence impacts the depth of machined holes significantly as described above (FIG. 10). The recast area increases with the laser fluence. Moreover, with the same laser fluence and same number of laser pulses, the maximum depth was obtained when the focal plane of the laser beam was located at the bottom surface of the stainless steel sheet (FIGS. 12 and 13).

Although the best mode contemplated by the inventors of carrying out the present invention is disclosed above, practice of the present invention is not limited thereto. It will be manifest that various additions, modifications and rearrangements of the features of the present invention may be made without deviating from the spirit and scope of the underlying inventive concept.

What is claimed is:

1. An apparatus to dispense a small scale material, the apparatus comprising:
    a support having a linear vertical opening;
    a capillary with a substantially linear vertical opening having a center longitudinal axis, the capillary being fixed in the linear vertical opening of the support and having a first end to receive the material and a second end, generally opposite the first end, to discharge the material; and
    a source of ultrasonic vibration mechanically coupled to the capillary generally orthogonal to an outer surface of the capillary and extending in a plane substantially parallel to and offset from a plane bisecting the capillary along the center longitudinal axis so as to cause motion of said material in a substantially helical path within the capillary substantially about the longitudinal axis.

2. The apparatus of claim 1, further comprising a three-axis stage that supports the substrate, wherein the stage is translated during deposition of the material.

3. The apparatus of claim 2, wherein a velocity at which the stage translates the substrate can be modified to change a characteristic of the deposited material.

4. The apparatus of claim 1, wherein a gap distance between the second end and the substrate can be modified to alter a characteristic of the deposited material.

5. The apparatus of claim 4, wherein the gap distance is less than about 170 μm.

6. The apparatus of claim 5, wherein the gap distance is less than about 85 μm.

7. The apparatus of claim 6, wherein, during operation, a velocity between the apparatus and the substrate is greater than about 4 mm/s.

8. The apparatus of claim 1, wherein the source of vibration is a piezoelectric actuator.

9. The apparatus of claim 8, wherein the piezoelectric actuator comprises a lead zirconium titanate (PZT) element having a resonant frequency.

10. The apparatus of claim 9, wherein the resonant frequency is at least 20 kHz.

11. The apparatus of claim 8, further comprising a power supply that drives the actuator, wherein an output of the power supply can be changed so as to facilitate discharge of the material towards the substrate.

12. The apparatus of claim 1, wherein the support includes an opening to receive the capillary so as to maintain a tight-fit relationship.

13. The apparatus of claim 1, wherein the apparatus controls a local characteristic of the deposited material in situ.

14. The apparatus of claim 1, wherein the material is one of a group including a dry powder and a biological material.

15. The apparatus of claim 14, wherein the material includes particles that are spherical.

16. The apparatus of claim 1, wherein the outer surface is at about a top portion of the capillary.

17. The apparatus of claim 1 wherein the source of ultrasonic vibration is coupled to the capillar substantial only at about a top portion of the capillary so as to generate a force on the capillary that travels from the top portion along the length of the capillary to facilitate the motion of the material.

18. The apparatus of claim 1, wherein the material is substantially dry and said second end has a diameter that is less than about 150 μm.

19. A particle feeding system, the system comprising:
    a support having a substantially linear vertical opening;
    a capillary with a substantially linear vertical opening having a center longitudinal axis, the capillary being fixed in the linear vertical opening of the support, the capillary having a first end to receive the particles and a second end, generally opposite the first end, to discharge the particles; and
    an actuator coupled to the capillary and extending in a plane substantially parallel to and offset from a plane bisecting the capillary along the center longitudinal axis so as to cause motion of the particles in a substantially helical path within the capillary substantially about the longitudinal axis.

20. The apparatus of claim 19, wherein the actuator is a piezoelectric plate.

21. The apparatus of claim 20, wherein the PZT plate is excited in the longitudinal direction at a frequency greater than about 20 KHz.

22. The apparatus of claim 19, further comprising a three-axis stage that supports the substrate, wherein the stage is translated during deposition of the material.

23. The apparatus of claim 22, wherein a velocity at which the stage translates the substrate can be modified to change a characteristic of the deposited material.

24. The apparatus of claim 19, wherein a cooling system is coupled to the actuator to improve the flow rate of the particles.

25. The apparatus of claim 24, wherein the actuator is a piezoelectric plate and the cooling system cools the actuator when the actuator is driven by a voltage generally above a threshold voltage.

26. The apparatus of claim 25, wherein the threshold voltage is about 225 V.

27. An apparatus comprising:
a feed mechanism that discharges a fabrication material towards a substrate, the feed mechanism including:
a support having a substantially linear vertical opening;
a capillary fixed in the substantially linear vertical opening of the support, the capillary having a first end to receive the fabrication material/bio-materials and a second end, generally opposite the first end, to discharge the fabrication material; and
a source of ultrasonic vibration mechanically coupled to the capillary to transmit ultrasonic vibration to the capillary so as to discharge the fabrication material from the second end towards a substrate to deposit the fabrication material and wherein the source of ultrasonic vibration is generally orthogonal to an outer surface of the capillary and extends in a plane substantially parallel to and offset from a plane bisecting the capillary along the center longitudinal axis so as to cause motion of said material in a substantially helical path within the capillary substantially about the longitudinal axis;
a three-axis stage that supports the substrate, wherein the stage is translated during deposition of the material; and
a laser to process the material to produce a pattern, and to micro-machine the pattern.

28. The apparatus of claim 27, wherein the fabrication material, is one of a group including a fine powder and a bio-material.

* * * * *